(12) United States Patent
Morris et al.

(10) Patent No.: US 9,362,725 B2
(45) Date of Patent: Jun. 7, 2016

(54) ELECTROMAGNETIC SHIELDED SLEEVE

(75) Inventors: David Drew Morris, Newnan, GA (US); Cheryl J. Brickey, Greer, SC (US)

(73) Assignee: Milliken & Company, Spartanburg, SC (US)

( * ) Notice: Subject to any disclaimer, the term of this patent is extended or adjusted under 35 U.S.C. 154(b) by 678 days.

(21) Appl. No.: 13/284,335

(22) Filed: Oct. 28, 2011

(65) Prior Publication Data
US 2013/0105215 A1 May 2, 2013

(51) Int. Cl.
| | | |
|---|---|---|
| H05K 9/00 | (2006.01) | |
| H01B 7/08 | (2006.01) | |
| H01R 4/00 | (2006.01) | |
| H02G 3/06 | (2006.01) | |
| H02G 15/08 | (2006.01) | |
| H02G 3/04 | (2006.01) | |
| D04B 21/16 | (2006.01) | |

(52) U.S. Cl.
CPC .............. *H02G 3/0412* (2013.01); *D04B 21/16* (2013.01); *H02G 3/0487* (2013.01); *H05K 9/0098* (2013.01); *D10B 2403/021* (2013.01); *D10B 2403/0243* (2013.01)

(58) Field of Classification Search
CPC .... H01B 7/083; H01B 7/0838; H01B 7/0861; H01B 11/08; H01B 11/1033; H01R 23/662; H01R 13/648; H05K 9/009; H05K 9/0098
USPC ...... 174/93, 117 M, 350, 388, 394, 357, 393; 361/816, 817; 277/920
See application file for complete search history.

(56) References Cited

U.S. PATENT DOCUMENTS

| | | | | |
|---|---|---|---|---|
| 2,761,203 | A | * 9/1956 | Witt, Sr. | 277/939 |
| 4,281,211 | A | 7/1981 | Tatum et al. | 174/36 |
| 4,442,314 | A | 4/1984 | Piper | 174/36 |
| 4,460,803 | A | * 7/1984 | Piper | 174/36 |
| 4,668,545 | A | 5/1987 | Lowe | 428/36 |
| 4,684,762 | A | 8/1987 | Gladfelter | 174/36 |
| 4,900,877 | A | * 2/1990 | Dubrow et al. | 174/351 |
| 5,084,594 | A | * 1/1992 | Cady et al. | 174/36 |
| 5,357,049 | A | 10/1994 | Plummer, III | 174/36 |
| 5,367,123 | A | * 11/1994 | Plummer et al. | 174/36 |
| 5,387,455 | A | * 2/1995 | Horsch | 428/116 |
| 5,532,429 | A | 7/1996 | Dickerson et al. | 174/36 |
| 6,304,698 | B1 | 10/2001 | Morris | 385/100 |
| 6,398,190 | B1 | 6/2002 | Li | 254/134.4 |
| 6,571,833 | B1 | 6/2003 | McLarty, III et al. | 138/116 |
| 6,671,440 | B2 | 12/2003 | Morris | 385/100 |
| 6,717,047 | B2 | 4/2004 | Haselby et al. | 174/35 R |
| 6,718,100 | B2 | 4/2004 | Morris | 385/100 |
| 6,727,197 | B1 | * 4/2004 | Wilson et al. | 174/117 R |
| 6,963,031 | B2 | 11/2005 | Gladfelter et al. | 174/74 A |

(Continued)

OTHER PUBLICATIONS

Definintion of "integral" from www.dictionary.com Dec. 12, 2014.*
Definintion of "within" from www.dictionary.com Dec. 12, 2014.*

*Primary Examiner* — Chau N Nguyen
*Assistant Examiner* — Roshn Varghese
(74) *Attorney, Agent, or Firm* — Cheryl J. Brickey

(57) ABSTRACT

An electromagnetic shielded sleeve containing a multilayer composite material formed in such a way as to define at least one longitudinal channel configured to enclose and carry a cable. The multilayer composite material contains a first textile, an electromagnetic shielding material, and a second textile, where the electromagnetic shielding material is located between the first textile and the second textile.

12 Claims, 4 Drawing Sheets

(56) References Cited

U.S. PATENT DOCUMENTS

| | | |
|---|---|---|
| 7,046,898 B2 | 5/2006 | McLarty, III ................. 385/134 |
| 7,078,615 B2 | 7/2006 | Gladfelter et al. .............. 174/36 |
| 7,176,387 B1 * | 2/2007 | Huang ......................... 174/393 |
| 7,235,737 B2 | 6/2007 | Rodrigues et al. .............. 174/36 |
| 7,754,971 B2 | 7/2010 | Bedingfield et al. .......... 174/117 |
| 7,799,997 B2 | 9/2010 | Bedingfield et al. ............ 174/93 |
| 8,371,339 B2 * | 2/2013 | Li et al. ..................... 139/420 R |
| 2006/0264137 A1 * | 11/2006 | Ishihara et al. ............... 442/304 |

* cited by examiner

ELECTROMAGNETIC SHIELDED SLEEVE

FIELD OF THE INVENTION

The present invention generally relates to electromagnetic shielded sleeves and electromagnetic shielded conduits containing electromagnetic shielded sleeves.

BACKGROUND

Covers have been provided for protecting transmission cables from abrasion and shielding them against unwanted electrical noises. Typically, these covers have included heavy material having a zipper or other mechanical closures making them relatively rigid and cumbersome in jacketing transmission cables and routing them in use. With the advent of more sophisticated electronics such as in computer, tele-communications, and missile systems, sensitive transmission cables having multiple conductors transmitting high frequency signals with rapid rise times have been required in which slight electrical and electromagnetic noises can be harmful. There is a need for an electromagnetic shielded sleeve for conduit applications.

BRIEF SUMMARY

In accordance with at least one exemplary embodiment, the present disclosure provides advantages and alternatives over the prior art by providing an electromagnetic shielded sleeve containing a multilayer composite material formed in such a way as to define at least one longitudinal channel configured to enclose and carry a cable. The multilayer composite material contains a first textile, an electromagnetic shielding material, and a second textile, where the electromagnetic shielding material is located between the first textile and the second textile. An electromagnetic shielded conduit containing the electromagnetic shielded sleeve is also disclosed.

DETAILED DESCRIPTION

Figure 1:
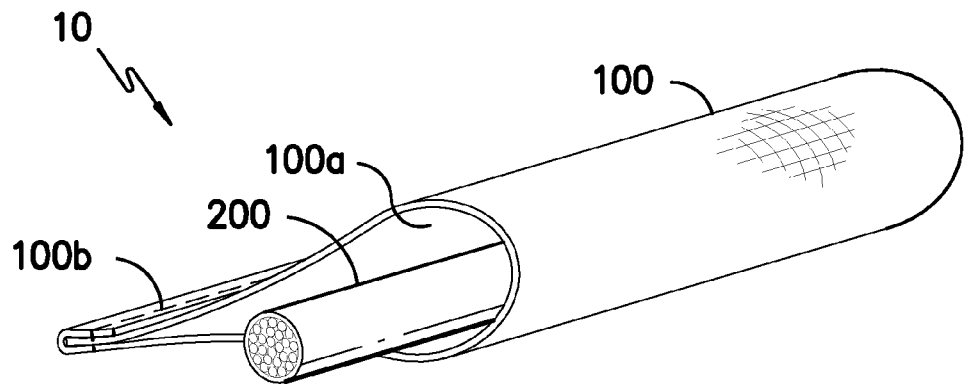
FIG. 1 illustrates one embodiment of the electromagnetic shielded sleeve containing a multilayered composite material formed in such a way to define one longitudinal channel

FIG. 1 illustrates an electromagnetic shielded sleeve 10 containing a multilayered composite material 100. The multilayered composite material 100 is formed in such a way to define one longitudinal channel configured to carry a cable 200 and has an inner surface 100a and an outer surface 100b.

The multilayered composite material 100 may be any suitable composite material having two textile layers (a first textile and a second textile) sandwiching an electromagnetic shielding material. The first textile, which forms the inner surface of the composite material, provides a low coefficient of friction for ease of pulling great lengths of cable through the sleeve 10. The second textile, which forms the outer surface of the composite material, provides a low coefficient of friction for ease of pulling great lengths of sleeve through conduits. The EM shielding material provides electromagnetic shielding to the cables contained within the sleeve. The EM shielding material shields against electromagnetic interference (EMI) and optionally radio frequency interference (RFI). Preferably, the first textile 110 and the second textile 130 cover both flat sides of the EM shielding material 120 (meaning that the EM shielding material 120 is covered by the textile layers 110, 130 everywhere but the 4 cut edges). In another embodiment, the EM shielding material 120 is completely encapsulated by the first textile 110 and the second textile 130.

Figure 2:
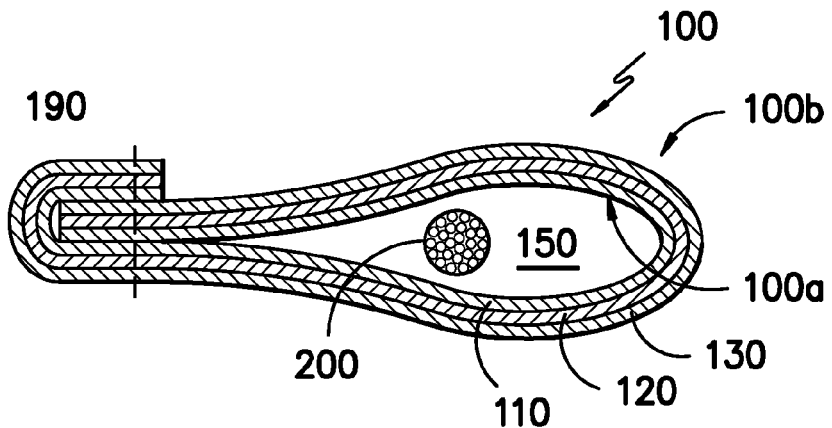
FIG. 2 illustrates the cross-section of one embodiment of the electromagnetic shielded sleeve where the multilayer composite material contains three layers.

FIG. 2 shows an enlarged view of a cross-section of one embodiment of the electromagnetic shielded sleeve 10 to show the multilayers within the multilayer composite material 100 where the composite material contains three layers. The multilayer composite material 100 contains a first textile 110, an electromagnetic (EM) shielding material 120, and a second textile 130, with the EM shielding material 120 sandwiched between the first textile 110 and the second textile 130. The first textile 110 forms the inner surface 100a of the multilayer composite material 100 and the second textile 130 forms the outer surface 100b of the multilayer composite material 100. The three layers (first textile 110, EM shielding material 120, and third textile 130) may be separate, attached intermittently with, for example stitching, patterned adhesive, or grommets, or may be continuously attached to each other.

Figure 3:
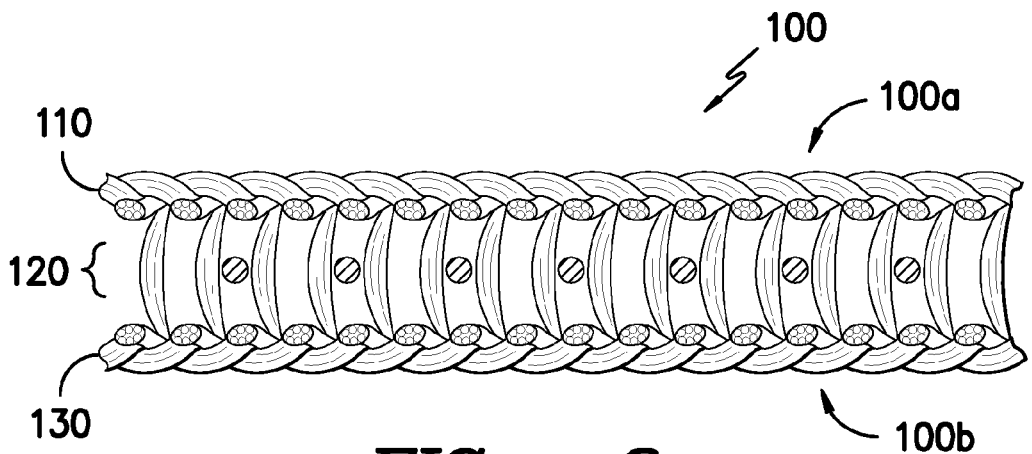
FIG. 3 illustrates the cross-section an embodiment of the multilayer composite material being a spacer fabric.

FIG. 3 shows an enlarged view of a cross-section of one section of the electromagnetic shielded sleeve 10 to show the multilayers within the multilayer composite material 100 where the composite material 100 is a spacer fabric. The spacer fabric contains an upper fabric surface forming the first textile 110 and a lower fabric surface forming second textile 130. The upper and lower fabric surfaces are parallel, spaced apart and connected by yarns. The EM shielding material 120 is sandwiched between the first textile 110 and the second textile 130. The EM shielding material, typically conductive yarns, are located between the yarns spacing the first textile 110 and the second textile 130. In another embodiment, the yarns spacing the first textile 110 and the second textile 130 are the EM shielding material. In this embodiment, the yarns spacing the first textile 110 and the second textile 130 would be conductive. The thickness of the spacer fabric (from the inner surface 100a to the outer surface 100b) is in one embodiment between about 3 millimeters to about 20 millimeters.

The first textile 110 forms the inner surface 100a of the multilayer composite material 100 and the second textile 130 forms the outer surface 100b of the multilayer composite material 100. Because the spacer fabric is integrally made, there is no need to further joining the layers (though more joining may be performed, if desired). The textiles formed as the first textile 110 and the second textile 120 may be any suitable textile (woven, nonwoven, knit) that may be produced by the spacer fabric manufacturing process. In one embodiment, the first textile 110 and the second textile 130 are woven. In another embodiment, the first textile 110 and the second textile 130 are knit. The EM shielding material 120 is preferably completely encapsulated by the textile layers 110, 130. This means that approximately none of the EM shielding material 120 is located on an outer surface of the multilayer composite material 100.

Figure 4:
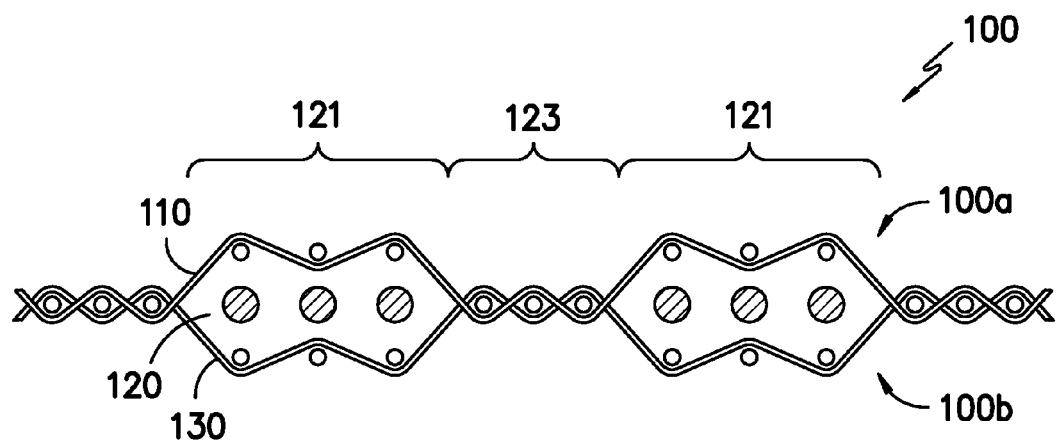
FIG. 4 illustrates the cross-section an embodiment of the multilayer composite material being multilayered fabric. The multilayered fabric is integrally woven such that the multilayered fabric comprises two layers of fabric in first discrete areas and one layer of fabric in second discrete areas.

FIG. 4 shows an enlarged view of a cross-section of another embodiment of the electromagnetic shielded sleeve 10 to show the multilayers within the multilayer composite material 100, where the composite material 100 is a multilayered fabric. The multilayered fabric is integrally woven such that the multilayered fabric comprises two layers of fabric in first discrete areas 121 and one layer of fabric in second discrete areas 123. The first discrete areas 121 of the multilayered fabric contain a first textile 110 forming a first layer and a second textile 130 forming a second layer with the EM shielding material 120 located between the first textile 110 and the second textile 130 in the first discrete areas 121 of the multilayered fabric. The second discrete areas 123 of the multilayered fabric contain the first textile 110 and the second textile 130 together in a single layer. The first textile 110 forms the inner surface 100a of the multilayer composite material 100 and the second textile 130 forms the outer surface 100b of the multilayer composite material 100. In another embodiment, the multilayered fabric may contain first discrete areas having one layer and second discrete areas containing three or more layers. The EM shielding material may be between any or all of the layers in the second discrete areas.

The first textile 110 and the second textile 130 may be formed from any suitable textile. The first textile 110 and the second textile 130 may be formed from the same textile, or may have different constructions and/or materials. The textiles (110, 130) used may be any suitable textile, but is preferably one that is flexible, has a low coefficient of friction, and a high tensile strength. The textile may be a knit, woven, non-woven, or unidirectional. The textile may have additional function chemistries such as low friction, fire resistance, adhesion, or color added. The chemistries may be added to the yarns during yarn formation or applied onto the yarns before or after textile formation. In one embodiment, the textile has a weight of about 2 to 20 ounces per yard and in another embodiment has a weight of about 10 to 12 ounces per yard.

The coefficient of friction of the textile layers 110, 130 is important. The outer textile 130 (which forms the outer surface of the sleeve 10) preferably has a low coefficient of friction to for easy insertion of the sleeve 10 into a conduit 300. The inner textile 110 preferably has a low coefficient of friction to for easy insertion cables, wires, and the like into the sleeve 10. In one embodiment, the textile layers 110, 130 have a dry static coefficient of friction within the range of about 0.010 to about 0.500. This range is more preferably from about 0.025 to about 0.250, and is preferably from about 0.035 to about 0.100. Preferably, the coefficient of friction for the textiles (110, 130) (dynamic or sliding coefficients of friction) is between about 0.06 to about 0.14, and a narrower range of about 0.08 to about 0.13, may also be used. In one embodiment, the breaking tensile strength of the textile is in the range of from about 45 kg/cm to about 70 kg/cm. In another embodiment, the elongation percentages of the textile are between 2% and 5% at 22.5 kg of force and between 5% and 10% at 45.5. Kg of force. The textiles preferably have a thickness of about 0.025 inches to 0.100 inches. The textiles preferably have a breaking strength of about 200 lb/cm to 600 lb/cm. The textiles preferably have air permeability of 10 cm3/cm2/s to 70 cm3/cm2/s. Preferably the textiles preferably have a rigidity of between about 100 and 400 grams force as measured by ASTM D6827.

The sleeve 10 preferably should be rigid enough to resist collapsing upon itself or bunching up under the influence of the pull lines and cables, but also should be flexible enough to be pulled easily through turns and undulation in the duct in which it is installed. The INDA IST90.3 test procedure is a method of determining the rigidity of the multilayer composite material. In this procedure, a test sample of flexible material is laid out over a slotted surface. A blade is then used to force the material through the slot. The results are expressed in terms of the applied force. In accordance with the invention, a strip of multilayer composite material extending longitudinally across the slot will be forced to bend along a transversely extending fold line. A strip of the multilayer composite material extending transversely across the slot will be forced to bend about a longitudinally extending fold line. The strip of multilayer composite material will typically have a lesser rigidity across its width. The correspondingly greater degree of flexibility across its width helps to avoid creasing and thereby helps the wider layers of the sleeve 10 to retain their more open configuration for easier insertion of cables and the like.

In one embodiment, the textile is a woven textile. The fabric base may also be, for example, plain, satin, twill, basket-weave, poplin, jacquard, and crepe weave textiles. Preferably, the woven textile is a plain weave textile. It has been shown that a plain weave textile has good abrasion and wear characteristics. A twill weave has been shown to have good properties for compound curves so may also be preferred for some textiles. The end count in the warp direction is between 35 and 70 in one embodiment. The denier of the warp yarns is between 350 and 1200 denier in one embodiment. In one embodiment, the textile is air permeable.

In another embodiment, the textile is a knit, for example a circular knit, reverse plaited circular knit, double knit, single jersey knit, two-end fleece knit, three-end fleece knit, terry knit or double loop knit, weft inserted warp knit, warp knit, and warp knit with or without a micro-denier face.

In another embodiment, the textile is a multi-axial, such as a tri-axial fabric (knit, woven, or non-woven). In another embodiment, the textile is a bias fabric. In another embodiment, the textile is a non-woven. The term non-woven refers to structures incorporating a mass of yarns that are entangled and/or heat fused so as to provide a coordinated structure with a degree of internal coherency. Non-woven fabrics for use as the textile may be formed from many processes such as for example, meltspun processes, hydroentangeling processes, mechanically entangled processes, stitch-bonded and the like. In another embodiment, the textile is a unidirectional textile and may have overlapping yarns or may have gaps between the yarns.

The yarns making up the textile may be any suitable yarn. "Yarn", in this application, as used herein includes a monofilament elongated body, a multifilament elongated body, ribbon, strip, fiber, tape, and the like. The term yarn includes a plurality of any one or combination of the above. The yarns may be of any suitable form such as spun staple yarn, monofilament, or multifilament, single component, bi-component, or multi-component, and have any suitable cross-section shape such as circular, multi-lobal, square or rectangular (tape), and oval.

Some suitable materials for the yarns include polyamide, aramid (including meta and para forms), rayon, PVA (polyvinyl alcohol), polyester, polyolefin, polyvinyl, nylon (including nylon 6, nylon 6,6, and nylon 4,6), polyethylene naphthalate (PEN), cotton, steel, carbon, fiberglass, steel, polyacrylic, polytrimethylene terephthalate (PTT), polycyclohexane dimethylene terephthalate (PCT), polybutylene terephthalate (PBT), PET modified with polyethylene glycol (PEG), polylactic acid (PLA), polytrimethylene terephthalate, nylons (including nylon 6 and nylon 6,6); regenerated cellulosics (such as rayon or Tencel); elastomeric materials such as spandex; high-performance fibers such as the polyaramids, and polyimides natural fibers such as cotton, linen, ramie, and hemp, proteinaceous materials such as silk, wool, and other animal hairs such as angora, alpaca, and vicuna, fiber reinforced polymers, thermosetting polymers, blends thereof, and mixtures thereof.

In one embodiment, the textile contains warp yarns and weft yarns which are monofilament. In another embodiment, the warp yarns are monofilament and the weft yarns are multi-filament. In another embodiment, the warp yarns are monofilament and the weft yarns are an alternating arrangement of monofilament and multifilament yarns. In another embodiment, the warp yarns and weft yarns are multi-filament. In another embodiment, the warp yarns are multi-filament. In another embodiment, the warp yarns are multifilament and the filling yarns are monofilament. The phrase "alternating arrangement" refers to a repeating pattern of monofilament to multifilament yarns. In one embodiment, the arrangement of monofilament to multifilament yarns is 1:1. Other ratios, such as 1:2, 1:3, 2:3, 3:4, or 3:5, for example, may also be employed, as product specifications dictate. For the embodiments containing monofilament yarns, the denier of the yarns is preferably between about 200 and 800 denier. For the embodiments containing multifilament yarns, the denier of the yarns is preferably between about 200 and 1,000 denier.

The EM shielding material 120 may be any suitable EM shielding material (and optionally also RFI shielding). In one embodiment, the EM shielding material 120 contains conductive yarns. Conductive yarns include, but are not limited to, carbon, graphite or conductive polymer yarns or comprise non-conductive yarns which are plated, coated or impregnated with a conductive material. Conductive yarns may also include metallic wires such as silver, gold, copper or fibers and/or yarns coated with metals. In another embodiment, the EM shielding material is a conductive textile (woven, non-woven, knit, or unidirectional) containing the conductive yarns described above. The textile containing conductive yarns may contain all conductive yarns or a percentage of conductive yarns and a percentage of non-conductive yarns. In one embodiment, the EM shielding material being a conductive textile contains between about 10 to 80% wt conductive fibers. In another embodiment, the EM shielding material is a continuous metal foil.

In another embodiment, the EM shielding material may contain more than one layer, for example two, three, or more layers. The amount of shielding needed may help determine the number of layers needed. In one embodiment, the EM shielding material contains a layer of metal foil and a conductive woven textile formed from conductive metal wires. When the EM shielding material contains more than one layer, the layers may be separate and discrete from one another, formed together, or attached together after each layer is formed (by adhesive, stitching, or other attachment means).

Figure 5:
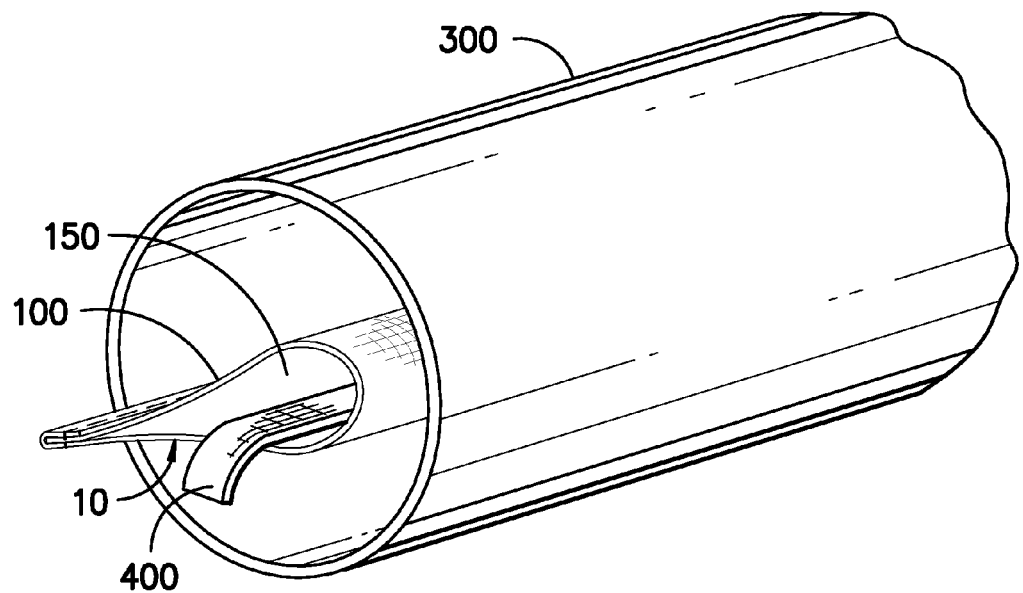
FIG. 5 illustrates one embodiment of the electromagnetic shielded conduit.

Referring now to FIG. 5, there is shown the electromagnetic shielded sleeve 10 in a conduit 300. The sleeve 10 contains a multilayer composite material 100 formed in such a way as to define at least one longitudinal channel 150 with a pull tape 400 in the channel 150. The sleeve 10 may be used in a conduit system or by itself, the sleeve 10 may be placed in the ceiling system of business buildings where the sleeve 10 is attached to a part of the ceiling, wall, or framing by any suitable means such as adhesive or grommets.

The conduit 10 (also sometimes referred to as a pipe or tube), may be any suitable conduit formed from an extrudable material such as a thermoplastic. The conduit may have any suitable wall thickness, inner diameter, and outer diameter. Conduits for use in the fiber optic field tend to have an inner diameter of about 12 mm to 50 mm. In other embodiments, the conduit may have a very large inner diameter, for example from about 100 mm to 150 mm, or may have a very small diameter such as less than about 50 mm. The conduit is preferably flexible. In one embodiment, the conduit is formed from a polymer selected form the group consisting of polyethylene, polypropylene, polyester, and polyvinyl chloride. The conduit may contain a bumpy finish to reduce the amount of contact the inner surface of the conduit has with the sleeve, cable, pull line, or other elongated structure. In one embodiment, the inner or outer surface of the conduit has a textured surface. One example of a textured surface is an "orange peel" finish, where the texture resembles the bumpy surface of the skin of an orange (fruit). This textured surface may serve to reduce the coefficient of friction and allow for easier insertion of cables or other elongated structures. The conduit may be smooth-wall, corrugated, or the like.

The sleeve 10 may also optionally contain a pull tape such as shown in FIG. 5. The pull tape is sometimes also referred to as a pull line or pull cord. Preferably, the yarns forming the textile layers (110, 130) of the composite material 100 and the materials of the pull tape 400 have respective values of elongation percentage that are substantially equal for a given tensile load. If the elongations of the materials differ substantially, one of those structures may lag relative to the other when they are pulled together through a conduit 300 in which they are to be installed together, thus resulting in bunching of the sleeve 10.

In a preferred embodiment, the pull tape 400 is formed of tightly woven, polyester material, which exhibits a tensile strength of between about 400 pounds and about 3,000 pounds. In an alternate embodiment, a twisted round rope (for example, a multi-ply cord) may be used, where such pull tapes 400 are made of polypropylene, polyester, and the like.

While the composite multilayer composite material 100 of FIG. 1 is formed in a tear-drop shape to define one longitudinal channel, any other configurations of multilayer composite material(s) 100 may be used as long as they define at least one longitudinal channel. Simple structures such as tube shaped fabric or multilayer composite material wrapped cables may also be used. FIGS. 6-9 illustrate alternative arrangements of the multilayer composite material(s) 100. The multilayer composite material(s) 100 may be any of the multilayer composite material(s) 100 described above, including but not limited to, a tri-layer structure, a spacer fabric, and a multilayered fabric.

Figure 6:
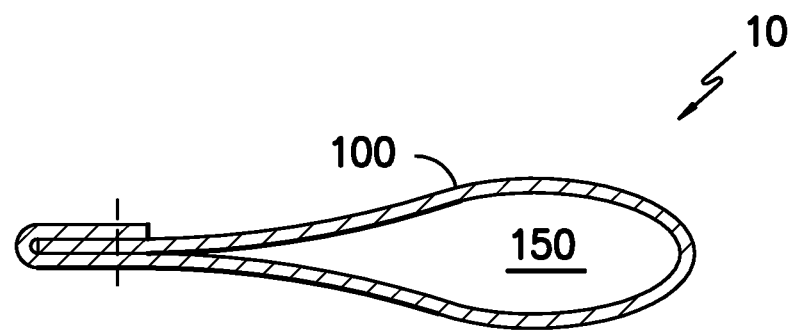
FIGS. 6-9 illustrate alternative configurations for the electromagnetic shielded sleeve.
Figure 7:
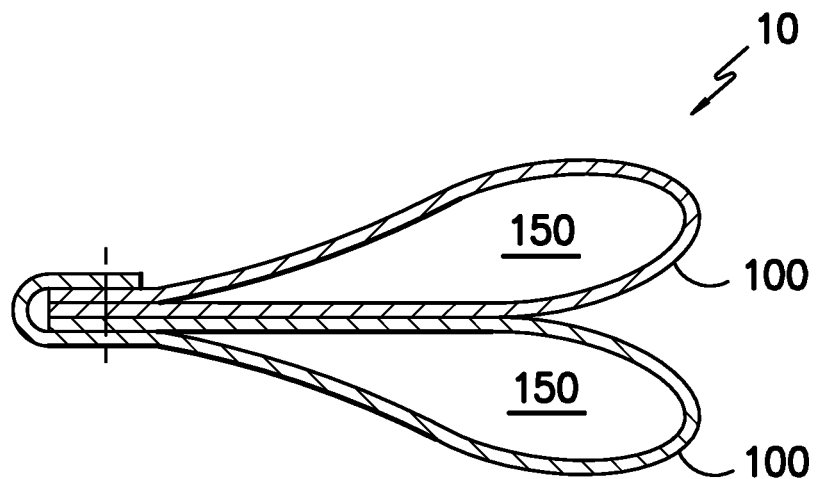

FIG. 6 illustrates the sleeve 10 of FIG. 1 as a cross-section view. The multilayer composite material 100 is formed into one tear-drop shaped channel 150. The tear-drop shape is formed from attaching the longitudinal edges (edges of the material along the longitudinal length) of the material 100 together. FIG. 7 illustrates a cross-section of an alternative sleeve 10 where one multilayer composite material 100 is formed into two tear-drop shaped channels 150. A two tear-drop shaped configuration may also be formed using two multilayer composite materials; each formed into a tear-drop channel then attached to one another.

Figure 8:
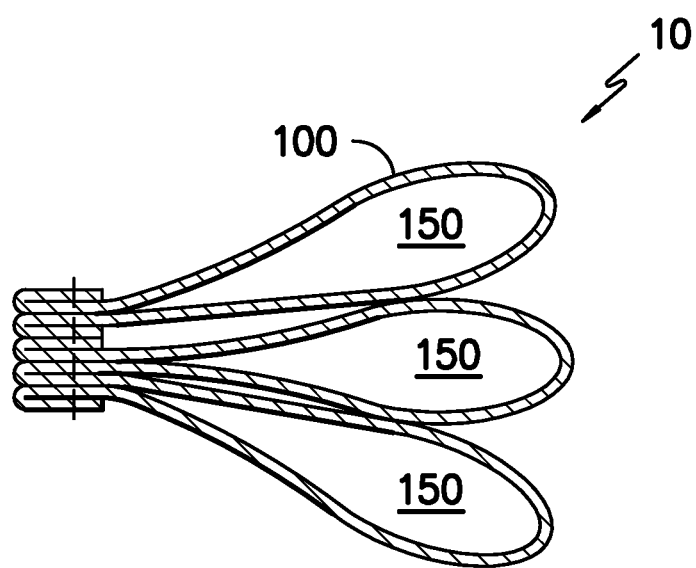

FIG. 8 illustrates a cross-section of an alternative sleeve 10 where two multilayer composite materials 100 are formed into three tear-drop shaped channels 150. This configuration is formed from one multilayer composite material forming single tear-drop shaped channel attached to a multilayer composite material forming two tear-drop shaped channels 150. Other configurations may be used for example, using three multilayer composite materials to form three tear-drop shaped channels which are then attached to one another.

Figure 9:
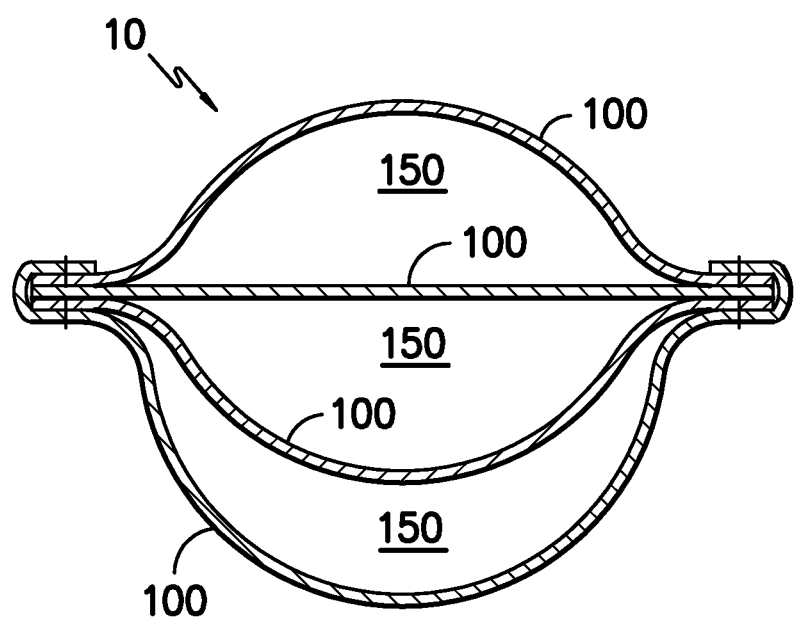

FIG. 9 illustrates a cross-section of an alternative sleeve 10 where four multilayer composite materials 100 are formed into three channels 150. The multilayer composite materials 100 are all attached on their longitudinal edges. For this arrangement, the outer surface of the multilayer composite material 100 is defined to the surface of the multilayer composite materials 100 facing away from the center of the sleeve 10 and the inner surface of the multilayer composite material 100 is defined to be the surface of the multilayer composite material 100 facing the center of the sleeve 10. Additional sleeve 10 configurations may be found in U.S. Pat. No. 7,799,997, issued Sep. 21, 2010, which is incorporated herein by reference in its entirety.

The configuration of the sleeve 10 will depend on the electrical device or other substrate to be shielded. Tubular shaped sleeves a may be made in a wraparound configuration. Closure may be by overlapping the fabric and may optionally be held in place by any suitable means. A preferred means of closure for a wraparound tubular article is a non-conductive zipper which has been coated or plated with a conductive metal and bonded or fused to the edges of the fabric forming the wraparound.

In one embodiment, the sleeve also includes a drain wire or ground wire. The drain wire may be incorporated as a warp yarn in one of the textile 100, 130. More than one drain wire can be used depending on the desired grounding configuration and the shielding effectiveness required.

In one embodiment, the sleeve 10 is fire resistant. The entire sleeve 10 may be made from fire resistant materials, or a portion of the materials in the sleeve may be fire resistant. In one embodiment, the textiles 110 and/or 130 may contain fiberglass yarns. The fiberglass yarns may be coated with PVC or some other acceptable material, including by way of example silicone, acrylics, polyethylene or other olefins. The textile containing the fiberglass yarns may be coated with binder, or the individual yarns may be coated prior to fabric formation. The coating may be used to provide protection to the brittle glass yarns, to add stability to the fabric, or to provide the necessary rigidity to the fabric to allow the chambers to be biased toward an open configuration. Alternatively, a multi-component yarn may be used in one or both of the textile layers, which has a glass core, wrapped with melamine, then wrapped with a fire resistant polyester. This alternative multi-component yarn is considered to be a core-sheath type of yarn. In another alternate embodiment, flame resistance may be imparted to the sleeve 10 by using other types of materials, including aramid fibers, melamine fibers, polyvinylidene fluoride (PVDF) fibers, or Alumina-Boria-Silica (ceramic) fibers.

Yet another method for imparting flame resistance to the sleeve 10 includes extruding yarn used in textile layers 110 and/or 130 with a flame-retardant additive in the base polymer, such as polyester and nylon. Potential additives that may be used in such an extrusion process include intumescent compounds including alumina trihydrate, magnesium oxides, magnesium borates; other boron containing compounds such as zinc borate, ammonium phosphate; residue forming carbonaceous materials including pentaerythritol, alkyd resins, or polyols; nitrogen containing compounds including melamine, and dicyandiamide, antimony oxides; halogenated organics, such as decabromodiphenyl oxide; phosphorous containing compounds such as ammonium phosphates; other phosphate salts, and organic phosphates. These flame retardants are commonly used in combination with each other such as a halogenated hydrocarbon system with antimony oxide.

Still another method of imparting flame retardant to the sleeve 10 is to treat the at least one of the layer 110, 120, 120 with a flame retardant coating. Possible flame-retardants that may be used for such a coating include the list set forth above, with or without a binder system.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An electromagnetic shielded sleeve comprising a spacer fabric having an upper surface and a lower surface formed in such a way as to define at least one longitudinal channel configured to enclose and carry a cable, wherein the spacer fabric is integrally formed and comprises:
   a first textile layer having a first width and forming the upper surface of the spacer fabric;
   a second textile layer having a second width and forming the lower surface of the spacer fabric, wherein the second textile is arranged in opposing back-to-back relation and spaced apart from the first textile;
   a plurality of connecting yarns interwoven with the first textile layer and the second textile layer connecting the first textile layer and the second textile layer to one another, wherein the plurality of connecting yarns is spaced at a first regular interval along the first width of the first textile layer and the second width of the second textile layer thereby providing adjacent sets of connecting yarns; and, an electromagnetic shielding material comprising a plurality of conductive yarns, wherein the conductive yarns are located between the first textile layer and the second textile layer, wherein the plurality of conductive yarns is spaced at a second regular interval along the first width of the first textile layer and the second width of the second textile layer and each conductive yarn is located between two adjacent connecting yarns, wherein the conductive yarns are not interwoven with the first textile, the second textile, or the connecting yarns, and wherein the spacer fabric does not contain any electromagnetic shielding material on an upper or lower surface of the spacer fabric.

2. The electromagnetic shielded sleeve of claim 1, wherein the distance between the upper surface and the lower surface of the spacer fabric is between about 3 millimeters and about 20 millimeters.

3. The electromagnetic shielded sleeve of claim 1, wherein the first textile layer and the second textile layer are woven.

4. The electromagnetic shielded sleeve of claim 1, wherein the first textile layer and the second textile layer are knit.

5. The electromagnetic shielded sleeve of claim 1, wherein the first textile layer forming the upper surface of the spacer fabric and the second textile layer forming the lower surface of the spacer fabric have a coefficient of friction of between about 0.06 and 0.14.

6. The electromagnetic shielded sleeve of claim 1, wherein the conductive yarns are selected from the group consisting of metallic wires, yarns coated with metals, and mixtures thereof.

7. An electromagnetic shielded conduit comprising a conduit and an electromagnetic shielded sleeve within the conduit, wherein the electromagnetic shielded sleeve comprises a spacer fabric having an upper surface and a lower surface formed in such a way as to define at least one longitudinal channel configured to enclose and carry a cable, wherein the spacer fabric is integrally formed and comprises:

a first textile layer having a first width and forming the upper surface of the spacer fabric;

a second textile layer having a second width and forming the lower surface of the spacer fabric, wherein the second textile is arranged in opposing back-to-back relation and spaced apart from the first textile;

a plurality of connecting yarns interwoven with the first textile layer and the second textile layer connecting the first textile layer and the second textile layer to one another, wherein the plurality of connecting yarns is spaced at a first regular interval along the first width of the first textile layer and the second width of the second textile layer thereby providing adjacent sets of connecting yarns; and, an electromagnetic shielding material comprising a plurality of conductive yarns, wherein the conductive yarns are located between the first textile layer and the second textile layer, wherein the plurality of conductive yarns is spaced at a second regular interval along the first width of the first textile layer and the second width of the second textile layer and each conductive yarn is located between two adjacent connecting yarns, wherein the conductive yarns are not interwoven with the first textile, the second textile, or the connecting yarns, and wherein the spacer fabric does not contain any electromagnetic shielding material on an upper or lower surface of the spacer fabric.

8. The electromagnetic shielded conduit of claim 7, wherein the distance between the upper surface and the lower surface of the spacer fabric is between about 3 millimeters and about 20 millimeters.

9. The electromagnetic shielded conduit of claim 7, wherein the first textile layer and the second textile layer are woven.

10. The electromagnetic shielded conduit of claim 7, wherein the first textile layer and the second textile layer are knit.

11. The electromagnetic shielded conduit of claim 7, wherein the first textile layer forming the upper surface of the spacer fabric and the second textile layer forming the lower surface of the spacer fabric have a coefficient of friction of between about 0.06 and 0.14.

12. The electromagnetic shielded conduit of claim 7, wherein the conductive yarns are selected from the group consisting of metallic wires, yarns coated with metals, and mixtures thereof.

* * * * *